(12) United States Patent
Lesmeister et al.

(10) Patent No.: US 6,295,623 B1
(45) Date of Patent: Sep. 25, 2001

(54) SYSTEM FOR TESTING REAL AND SIMULATED VERSIONS OF AN INTEGRATED CIRCUIT

(75) Inventors: Gary J. Lesmeister, Hayward; John Matthew Long, Milpitas, both of CA (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/240,181

(22) Filed: Jan. 29, 1999

(Under 37 CFR 1.47)

(51) Int. Cl.$^7$ ............................. G01R 31/28; G06F 11/00
(52) U.S. Cl. ........................... 714/741; 714/735; 714/724
(58) Field of Search ................................... 714/741, 742, 714/735, 736, 724, 738

(56) References Cited

U.S. PATENT DOCUMENTS

| | | | |
|---|---|---|---|
| 3,927,371 | * | 12/1975 | Pomeranz et al. .................. 324/73 R |
| 4,773,028 | * | 9/1988 | Tallman ............................... 364/550 |
| 5,574,853 | * | 11/1996 | Barch et al. ..................... 395/183.06 |
| 5,633,813 | * | 5/1997 | Srinivasan ........................... 364/578 |
| 5,696,772 | * | 12/1997 | Lesmeister ............................ 371/27 |
| 5,740,086 | * | 4/1998 | Komoto ............................... 364/580 |
| 5,859,962 | * | 1/1999 | Tipon et al. .................... 395/183.09 |

* cited by examiner

Primary Examiner—Albert Decady
Assistant Examiner—Samuel Lin
(74) Attorney, Agent, or Firm—Daniel J. Bedell; Smith-Hill and Bedell (57) ABSTRACT

A system for testing both simulated and real versions of an integrated circuit (IC) includes an IC simulator, a simulator manager, an IC tester, and a tester manager. The IC simulator simulates response of the IC to a set of simulated IC input signals by producing a set of simulated IC output signals. The simulator manager, programmed by a user-supplied test bench file, provides the simulated IC input signals to the simulator during the simulation. During the simulation, the simulator manager also generates a set of waveform data sequences, each representing periodically sampled values of a corresponding one of the simulated IC input and output signals. The IC tester includes a separate channel corresponding to each real IC input and output signal. The tester manager converts the waveform data sequence corresponding to each simulated IC input and output signal to a separate set of instructions provided as input to a corresponding one of the IC tester channels. When testing the real IC, each IC tester channel corresponding to a real IC input signal responds to its input instructions by generating and supplying to the IC an input signal having the sequence of values indicted by the waveform data sequence representing the corresponding simulated IC input signal. Each IC tester channel corresponding to an IC output signal responds to its input instructions by periodically sampling the corresponding IC output signal to determine whether the IC output signal has the sequence of values indicated by the waveform data sequence representing the corresponding simulated IC output signal.

14 Claims, 4 Drawing Sheets

SYSTEM FOR TESTING REAL AND SIMULATED VERSIONS OF AN INTEGRATED CIRCUIT

BACKGROUND OF THE INVENTION

1. Field of the Invention

The present invention relates in general to integrated circuit (IC) testers and in particular to an IC tester that is seamlessly integrated with an IC simulator so that they may be programmed in the same manner to perform similar tests on simulated and real versions of an IC.

2. Description of Related Art

An integrated circuit (IC) designer typically develops a model of an IC and then tests the model using an integrated circuit simulator. When the test indicates the model operates correctly, the designer uses synthesis and mapping tools to convert the model into a set of masks needed to fabricate a real IC. After the IC has been fabricated a test engineer tests the IC using an integrated circuit tester. It would be helpful if an IC tester could perform the same test on the real IC that the simulator performed on the simulated IC. However due to differences in capabilities of simulators and circuit testers and the manner in which they are programmed, an integrated circuit tester often cannot perform the same test on a real IC that a circuit simulator performs on its simulated counterpart.

In an IC simulator, the nature of the IC to be simulated is typically defined by a device model file (a "netlist") written in a hardware description language such as Verilog or VHDL. The device model file describes the circuit as a set of components connected between circuit nodes, with the response of each component being defined by mathematical expressions relating states of component input signals and time (independent variables) to states of component output signals (dependent variables). An input "test bench" file indicates the manner in which the simulated part is to be tested by indicating how signals at various circuit input nodes are to change state over time. As it carries out the test, the simulator repeatedly increments a "time" variable by a small amount, evaluates the response of all components after each time increment, and produces output "change dump" data indicating how the states or values of signals at the various circuit nodes change with time. This data can then be analyzed to determine how the simulated circuit responds to the input signals.

An integrated circuit tester includes a set of pin electronics circuits, each for carrying out test activities at a separate DUT terminal. An IC tester typically organizes a test into a succession of "test cycles" of uniform duration. During each test cycle, each pin electronics circuit can carry out any one of a limited number of test activities at a DUT terminal. Test activities may include, for example, changing the state of a test signal at a DUT input terminal or sampling the state of a DUT output signal at some particular time during a test cycle. Each pin electronics circuit requires an input test vector (an instruction) before the start of each test cycle to indicate the action the pin electronics circuit is to carry out during the test cycle and a time during the cycle at which it is to carry out that action.

An IC tester has several limitations not shared by a simulator that can render it unable to carry out the same test that a simulator can carry out. First, while a simulator can simulate and test an IC model having any number of I/O terminals, an IC tester can access only a limited number of IC pins. Thus the "bounded pin domain" of a tester (its ability to access only a limited number of IC pins) may prevent it from carrying out a test on a large IC that corresponds directly to a test defined by an HDL test bench.

Second, an IC tester may not be able to carry out the same test as a simulator because it has a limited capacity to store test vectors. A test can involve millions of test events. The test bench file input to a simulator can use a relatively compact algorithm to define millions of test events. Although it takes time to execute an algorithm during the simulation, to a simulator, "time" is just a variable to be incremented as the test progresses. Since the simulator does not have to increment "simulated time" until it is ready to do so, the simulator can take all the real time it needs between simulated time increments to execute the algorithm and to carry out the test instructions it generates. An IC tester, on the other hand, operates in real time because test events must occur in real time. The IC tester therefore does not have unlimited time between test events to execute algorithmic instructions as a test proceeds. Therefore, though a test engineer may initially prepare an algorithm indicating how the test of an IC is to proceed, a host computer will typically execute that algorithm before the test starts to produce sequences of instruction (vectors) defining each step of the test. The host computer then writes those vector sequences into high speed memories within the tester. It may well be that the vector sequence needed to define a test a simulator can carry out can be too large for the tester's vector memories. The length of a test that an IC tester can carry out is therefore limited by the size of its vector memories. Thus due to its "bounded data domain", an IC tester may not be able perform tests as long as those that may be performed by a simulator.

Third, an IC tester may not be able to perform a test carried out by a simulator because it cannot carry out test events in real time as frequently as a simulator can in simulated time. An IC simulator can take as much real time as it needs to simulate any sequence of test events with any desired simulated event timing. However an IC tester, which must operate in real time, is limited in how frequently it can change the state of a test signal or sample an IC output signal. Its "bounded time domain" therefore limits the tester's ability to carry out some sequences of test events.

Thus due to its bounded pin, data and time domains, a tester often cannot test a real IC in the same way that a simulator can test an IC model. It is therefore usually not possible to directly convert a test bench file into a set of instructions for an IC tester. Typically a trained IC test engineer must design a separate test for the real IC that takes into account the limitations of the IC tester. The need for a test engineer other than the IC designer to program an IC tester to perform a test that differs from the test performed by a simulator adds much time and expense to the IC development process and also makes it less certain as to whether the real and simulated ICs are truly comparable in performance.

It would therefore be beneficial to provide a system that would allow an IC circuit designer to test both a simulated IC and its real IC counterpart in exactly the same manner.

SUMMARY OF THE INVENTION

The present invention relates to an integrated circuit (IC) simulation and testing system that integrates the operation of an IC simulator and an IC tester so that it can test both simulated and real versions of an IC in a similar manner in response to a single set of test instructions.

In accordance with one aspect of the invention, the system includes an IC simulator, a simulator manager, an IC tester, and a tester manager. The IC simulator simulates response of the IC to a set of simulated IC input signals by producing a set of simulated IC output signals. The simulator manager, programmed by user-supplied test instructions, provides simulated IC input signals to the simulator during the simulation and monitors simulated IC output signals to determine whether they match expected states at various times during the simulation.

In accordance with another aspect of the invention, the simulator manager also generates a set of waveform data sequences, each representing periodically sampled values of a corresponding one of the simulated IC input and output signals. The IC tester includes a separate channel corresponding to each real IC input and output signal. The tester manager converts the waveform data sequence corresponding to each simulated IC input and output signal to a separate set of instructions and provides each set of instructions as input to a corresponding one of the IC tester channels.

In accordance with a further aspect of the invention, when testing the real IC, each IC tester channel corresponding to a real IC input signal responds to its input instructions by generating and supplying to the IC an input signal having the sequence of values indicted by the waveform data sequence representing the corresponding simulated IC input signal.

In accordance with a still further aspect of the inventions, each IC tester channel corresponding to an IC output signal responds to its input instructions by periodically sampling the corresponding IC output signal to determine whether the IC output signal has the sequence of values indicated by the waveform data sequence representing the corresponding simulated IC output signal.

It is accordingly an object of the invention to provide a system for testing both simulated and real versions of an IC in a similar manner in response to a single set of test instructions.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Hardware Architecture

Figure 1:
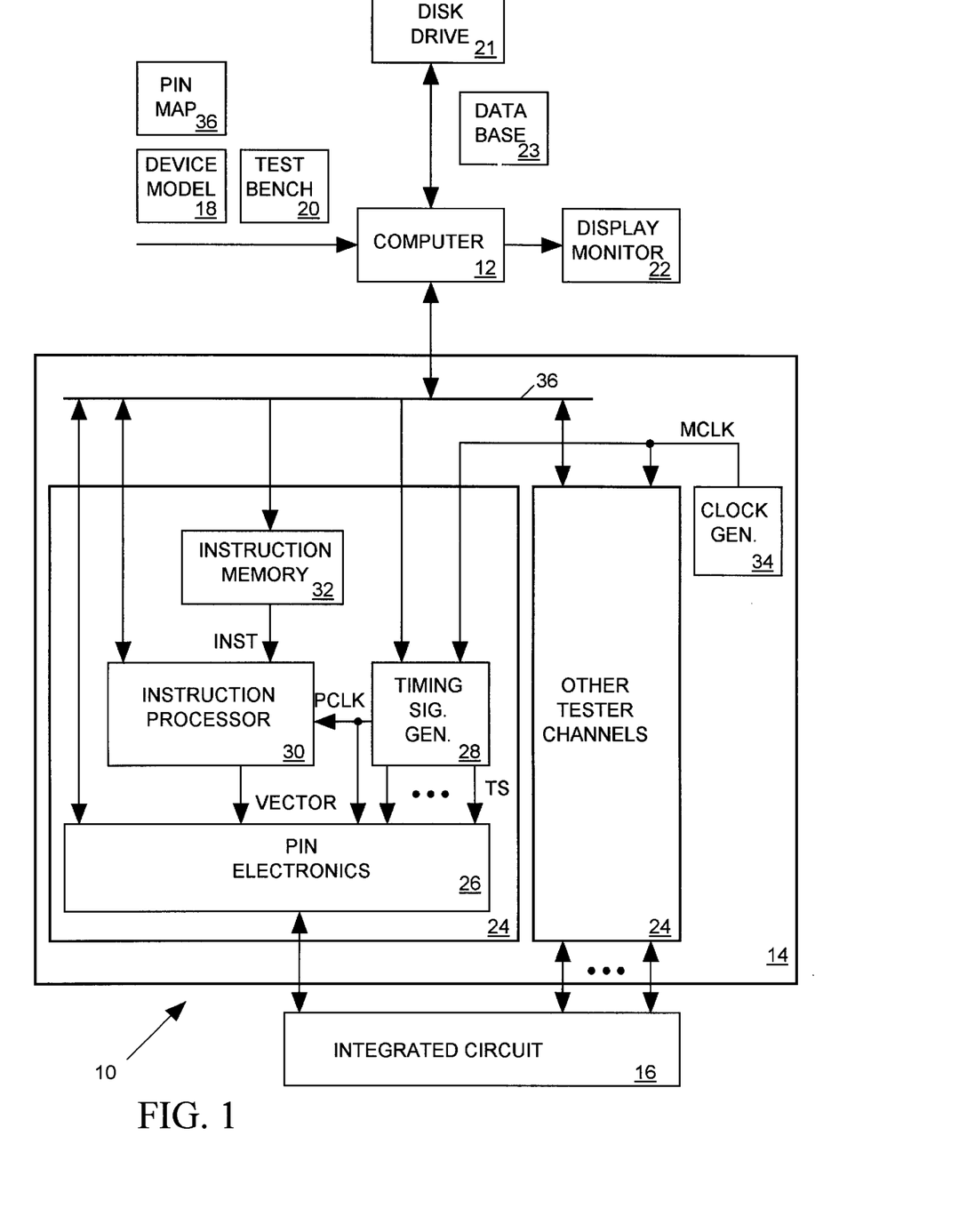
FIG. 1 illustrates in block diagram form an integrated circuit (IC) testing system in accordance with the present invention.

FIG. 1 illustrates an integrated circuit (IC) testing system 10 in accordance with the present invention for testing both real and simulated versions of an IC. Test system 10 includes a computer 12, an IC tester 14 and a display monitor 22.

Computer 12 executes software for testing the simulated version of the IC in response to input test instructions from a user and for automatically programming IC tester 14 so that it tests the real version of the IC 16 in a similar manner. Test system 10 displays results of test of both real and simulated versions of the IC on display monitor 22 in a similar manner so that it is easy for the user to compare them.

The user provides three input files to computer 12. A conventional device model 18 written in the well-known Verilog hardware description language describes the IC to be simulated as a set of components connected between circuit nodes. Device model 18 describes the behavior of each component by one or more mathematical expressions relating dependent variables (component output signal values) to independent variables (input signal values and time). A user-supplied "test bench" 20 provides instructions for testing the IC model describing when simulated input signals are to change state over time and indicating expected values of simulated IC output signals at various times. A user-provided "pin map" file 36 relates each pin of the real integrated circuit 16 to an IC input or output signal of the device model and indicates how each IC pin is connected to tester 14.

Computer 12 executes a conventional Verilog simulator stored in a disk drive 21 for simulating operation of the IC defined by device model 18. Computer 12 also executes simulator manager software (described in detail below) that responds to the test instructions included in test bench 20 by transmitting simulated IC input signals to the simulator. The simulator manager also response to test instructions by sampling simulated IC output signals generating simulator fail data (SFAIL) indicating whether the simulated IC output signals match expected states at various times. During the simulation, the simulator manager also periodically samples all simulated IC input and output signals to produce a separate waveform data sequence representing each signal as a succession of signal values. The simulator manager stores the waveform data sequences, including the SFAIL data, in disk drive 21.

Thereafter, in response to commands from the user, computer 12 uses display monitor 22 to display simulated IC input and output signal waveforms based on the waveform data produced by the simulator program, and displays icons indicting when simulated IC output signals fail to match expected values. Computer 12 may also display lines of code of test bench 20 that indicate those expected values, thereby providing the user with an indication of which parts of the test, if any, caused a simulated IC failure.

After the simulation, when IC 16 has been fabricated and connected to IC tester 14, the user supplies pin map 36 to computer 12 to tell it which pins of IC 16 access the various IC input and output signals and how the IC pins are connected to tester 14. Computer 12 then executes a tester manager program which reads the waveform data sequences representing the simulated IC input and output signals and converts them to instructions for tester 14. Those instructions tell tester 14 to send to IC 16 the pattern of input signals represented by the waveform data sequences and to monitor output signals IC 16 produces in response to those input signals to determine whether the real IC output signals match the simulated IC output signal patterns represented by the waveform data sequences.

IC tester 14 includes a set of tester channels 24, each connected to a separate terminal of IC 16. Each tester channel 24 includes a pin electronics circuit 26, a timing signal generator 28, an instruction processor 30 and an instruction memory 32. A test performed by tester 14 is organized into a succession of test cycles having the same frequency that the simulator manager used when sampling simulated IC input and output signals to produce the waveform data. A period clock signal (PCLK) produced by the timing signal generator 28 indicates the start of each test cycle. During each test cycle test instruction processor 30, executing instructions stored in instruction memory 32, generates a data value (vector) indicating an action pin electronics circuit 26 is to carry out during a next test cycle. For example, if pin electronic circuit 26 is to change the state of a test signal to be supplied to IC 16 during the next test cycle, the incoming vector indicates the state to which the test signal is to change and a time during the test cycle at which the test signal is to change its state. If pin electronics circuit 26 is to sample an IC 16 output signal during the next cycle, the vector indicates a time at which the IC output signal is to be sampled and an expected state of the IC output signal. Pin electronics circuit 26 carries out the indicated action during the next test cycle using a set of timing signals TS produced by timing signal generator 28 as timing references. Timing signals TS are distributed in phase so that an edge of each timing signal occurs at a different time during a test cycle. During the test, a master clock signal generator 34 supplies a master clock signal MCLK to the timing signal generator 28 of each tester channel 24. The timing generators 28 use the MCLK signal as a timing reference when generating the PCLK and TS signals so that operations of channels 24 are closely synchronized.

When the user provides computer 12 with pin map 16 indicating which tester channel 24 is connected to each terminal of IC 16, computer 12 reads the waveform data sequences that it generated during IC simulation, converts each sequence into a separate set of program instructions, and writes the instructions into the instruction memory 32 of a corresponding tester channel 24 via a memory bus 36. Computer 12 also sends control data to the timing signal generator 28 of each channel 24 indicating the test cycle period. Each timing signal generator 28 then appropriately adjusts the period of its output clock signal PCLK to match the indicated test cycle period.

Having appropriately programmed each channel 24, computer 12 concurrently sends a start signal via bus 36 to the instruction processor 30 of each channel 24 telling it to start the test. The instruction processor 30 of each channel 14 then begins executing instructions in its instruction memory 32 and sending a vector to the local pin electronics circuit 26 for each test cycle. During the test each pin electronics circuit 26 monitoring an IC output signal stores tester fail (TFAIL) data indicating whether the IC output signal fails to match its expected value. An instruction processor 30 of one channel 24 signals computer 12 via bus 36 when the test is complete. Computer 12 then reads the TFAIL data out of the pin electronics circuit 26 of each channel 24 monitoring an IC output signal and adds the TFAIL data to waveform data sequence representing the corresponding simulator output signal.

Thereafter, in response to commands from the user, computer 12 may again display IC output signal waveforms based on data produced by the simulator program and may also display corresponding lines of code of test bench 20 indicating expected output signal values just as it did after testing the simulation version of the IC. However this time, instead of annotating the waveform display with icons indicating times at which simulated IC output signals failed to match expected states, computer 12 annotates the waveform display with fail icons indicating times at which real IC 16 output signals values failed to match values of corresponding simulated IC output signals. Thus the user not only programs system 10 for both simulated and real IC test using the same test bench file 20, the user also views the results of the two tests on display monitor 22 in a similar manner. This makes it easy for the user to determine whether the real IC 16 behaves like its simulated counterpart.

Data Flow

Figure 2:
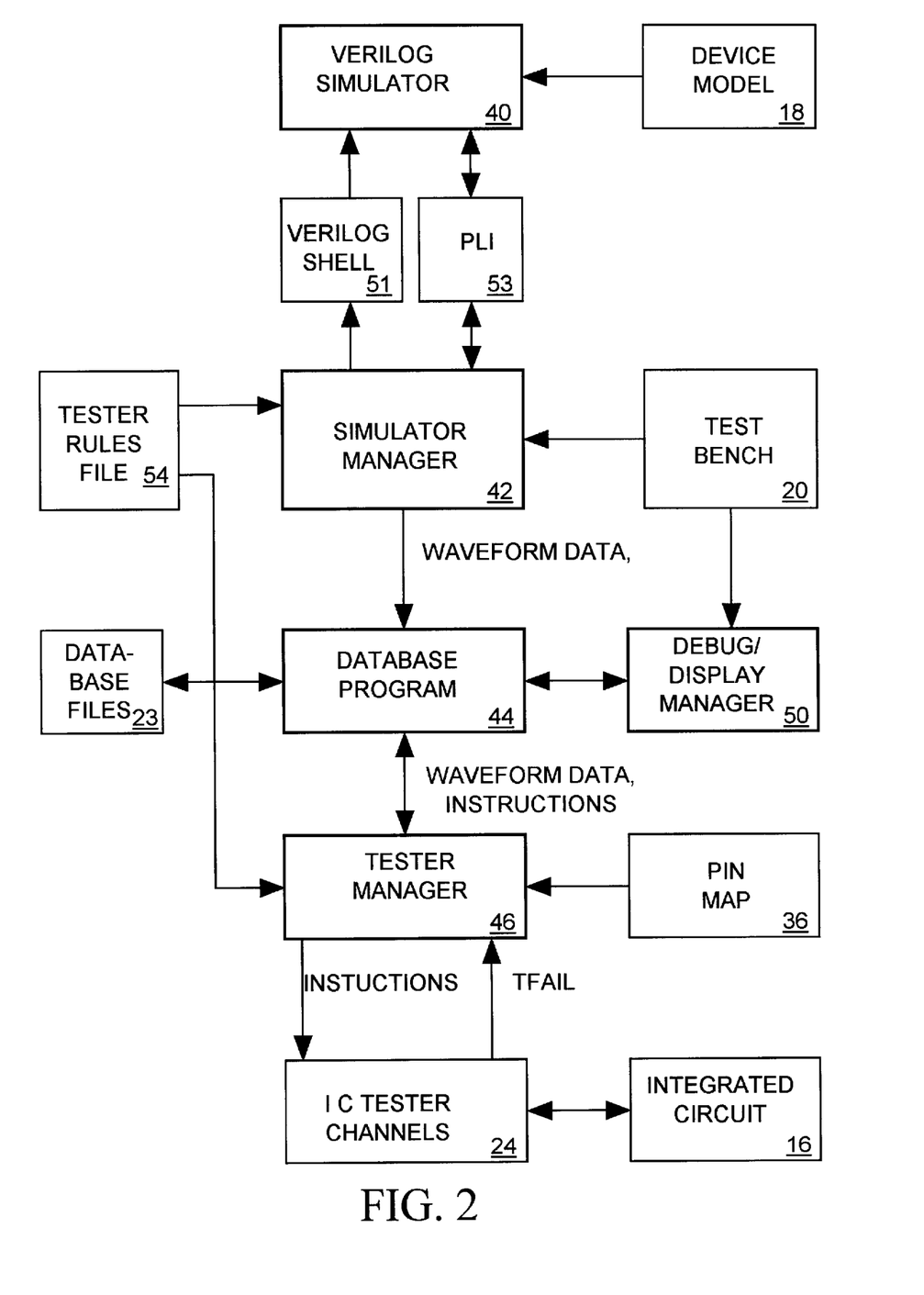
FIG. 2 illustrates data flow between various software and hardware components of testing system of FIG. 1.

FIG. 2 illustrates data flow between various software and hardware components of test system 10 of FIG. 1. Computer 12 of FIG. 1 stores and executes five programs: a conventional Verilog simulator 40, a simulator manager 42, a database program 44, a tester manager 46, and a debug/display manager 50.

Simulator manager 42 communicates with simulator 40 during the simulation via a conventional Verilog programming language interface (PLI) 53. Simulator manager 42, programmed by test bench 20, supplies simulated input signals to simulator 40, monitors simulator output signals to generate the SFAIL data, and periodically samples simulator input and output signals to produce the waveform data sequences. To initiate simulation, simulator manager 42 supplies a conventional Verilog shell file 51 to simulator 40 referencing device model 18 and describing how simulator 40 is to communicate with simulator manager 42 during a test.

The waveform data that simulator manager 42 produces indicates the state of each simulated IC input and output signal at some point during each cycle of a simulated system clock signal generated by simulator 40. As described below, test bench 20 separately defines for each IC signal the particular time during each system clock signal cycle that the simulator manager 42 is to sample each input and output signal. Simulator manager 42 also determines the current input/output direction of each signal and includes direction indicating bit with the waveform data it produces for each test cycle. Each element of each waveform data sequence simulator manager 42 produces is of the form (VALUE,DIR, SFAIL) where VALUE is the value of the signal or group of signal during the test cycle associated with the position of the element in the sequence, DIR is a bit indicating signal direction during the test cycle, and SFAIL is a field indicating whether the VALUE field failed to match an expected value (if any) for signal during the test cycle.

As it samples the IC input and output signals and generates the waveform data, simulator manager 42 invokes database program 44 telling it to store the waveform data in a set of database files 23. The waveform data includes a header file providing additional information about the signal represented by the waveform data including signal name, the system clock cycle period, and "timeset" information indicating the particular time during each system clock cycle that the signal was sampled.

When the real IC 16 has been fabricated and connected to tester 14, the user provides pin map 36 to tester manager 46 telling it which channel of IC tester 14 provides the tester manager for each input or output signal of IC 16. Tester manager 46 then invokes database program 44 to acquire the waveform data sequence for each IC input or output signal. Tester manager 46 processes the VALUE and DIR fields of each waveform data sequence corresponding to each cycle of the test to produce a set of algorithmic instructions for a corresponding tester channel 24. For each test cycle in which the corresponding DIR field indicates the signal is an IC input signal, the instructions tell the channel to drive an IC input signal to the value indicted by the corresponding VALUE field at the time during the test cycle indicated by timeset data included in the waveform data header. For each test cycle in which the DIR field indicates that a signal is to act as an IC output signal, the instructions tell the channel to sample the IC output signal value at a time indicated by timeset data, to compare the sampled IC output value to the waveform data sequence VALUE field corresponding to that test cycle, and to produce TFAIL data indicating the result of the comparison.

Tester manager 46 also reads the header included with each waveform data to determine the test cycle length and provides input data to the timing signal generator 28 (FIG. 1) of each tester channel 24 to set the period of the PCLK signal. The pin map 36 provided by the user also indicates the high and low logic levels for each IC pin. Tester manager 46 reads that information and sends control data to the pin electronics circuit 26 of each channel 24 (FIG. 1) to appropriately set the logic levels of the channel's drivers and comparators.

After programming tester 14, tester manager 46 signals tester 14 to start testing IC 16. During the test, each the pin electronics circuit 26 of each channel 24 monitoring an IC output signal generates and stores a sequence of TFAIL data bits indicating whether the output signal matches its expected state during each cycle of the tests. When the test is complete, tester manager 46 acquires the stored TFAIL data for each IC output signal from tester channels 24 and writes it into TFAIL fields of the waveform data sequences representing the corresponding simulated output signals via database program 44.

When the user thereafter invokes debug/display manager 50 and indicates which waveforms are to be displayed, debug/display manager 50 reads the appropriate waveform data sequences out of database files 23 via database program 44 and generates the waveform displays on display monitor 22 based on that waveform data. Debug/display manager 50 generates information on the waveform display to indicate times at which the SFAIL fields indicate simulated IC output signals failed to match expected values and to indicate times at which the TFAIL data indicate the real IC output signals failed to match corresponding simulated IC output signals. When commanded by the user, debug/display manager 50 also displays lines of test bench 20 code that define expected simulator IC values. This enables the user to quickly determine the test conditions that elicited a simulated IC output signal failure.

Test Bench and Simulator Manager

Test bench 20 tells simulator manager 42 how to test the circuit defined by the device model 18 and simulated by simulator 40. In particular test bench 20 defines the various simulated IC input and output signals passing between simulator 40 and simulator manager 42 via PLI 53, indicates times when the simulated IC input signals are to change values and indicates when simulator manager is to compare simulated IC output signals to expected values. Conventional Verilog simulator 40 does not organize a test into successive cycles as do IC tester channels 24. However in accordance with the invention, device model 18 includes a clock signal generator for generating a simulated output "system clock" signal having a period matching the test cycle period to be used by tester channels 24. Test bench 20 identifies the system clock signal and restricts state changes in each simulated IC input signal and in sampling of each simulated IC output signal to one particular time during each system clock signal cycle. Thus activities of simulator manager 40 in producing simulated IC input signals and sampling simulated IC output signals are "cyclized" in the manner tester channels 24 cyclized production of real IC input signals and sampling of real IC output signals.

When the system clock is to be produced at an IC node called "sys.sysclk", the following test bench code defines the system clock signal and links it to the model node:

verilog_node CLOCK "sys.sysclk".

Test bench 20 also includes code defining each IC input, output or input signal or related signal group by name, type (input,output,input/output), and associated model node or nodes. The clock signal generator included in device model 18 also generates a set of reference clock signals, each having the same period as the system clock signal but each shifted in phase so that its edges occur at particular times during each system clock signal cycle. When defining an IC input or output signal, test bench 20 assigns the input or output signal to one of the reference clock signals and defines a timing pattern for that signal indicating when the IC signal is to be sampled or driven relative to edges of its assigned reference clock signal. For example the following code defines four different timing patterns (TIMING_A through TIMING_D), two different reference clock signals (subsys1.clk and subsys2.clk), several IC signals (subsys1.data, subsys1.output, subsys1.str) that are assigned to the subsys1.clk reference clock signal, and several signals (subsys1.data, subsys1.output, subsys1.str) assigned to the subsys2.clk reference clock signal:

define TIMING_A PSAMPLE #-1 PHOLD #6
define TIMING_B PSAMPLE #-2 PHOLD #5
define TIMING_C NSAMPLE #-1 PHOLD #5
define TIMING_D PHOLD #3 interface subsys1 {
inout [7:0] data TIMING_A verilog_node "sys1.D[7:0]"
output [7:0] addr TIMING_D verilog node "sys1.A[7:0]"
input clk CLOCK verilog_node "clock gen.clkl"
input str TIMING_C verilog_node "sys1.str"
}
interface subsys2 {
inout [15:0] data TIMING_B verilog_node "sys2.D [15:0]"
output [63:0] addr TIMING_D verilog node "sys2.A [63:0]"
input clk CLOCK verilog_node "clock_gen.clk2"
input str TIMING_C verilog_node "sys2.str"
}

The terms "input", "output" and "inout" indicate whether the signal being defined is a simulator manager 42 input signal (i.e. a simulator 40 output signal), a simulator manager 42 output signal (i.e. a simulator 40 input signal), or a bidirectional input/output signal ("inout").

The above code indicates, for example, that a group of eight simulated bidirectional signals called "subsys1.data [7:0]" are to be connected between simulator manager 42 and a set of eight device model nodes called "sys1.D[8:0]" via PLI 53. The code also indicates that the subsys1.clk signal appearing at model node "clock_gen.clk1" is to control the timing of test activates with respect to the subsys1.data signals in accordance with the TIMING_A pattern. According to the TIMING_A pattern, when the subsys1.data signal is acting as an IC output signal, it is to be sampled one time unit before the rising edge of the reference clock signal (subsys1.clk) and that when the subsys1.data signal is acting as an IC input signal, a state change occurring during any system clock signal cycle is to occur six time units after the rising edge of the subsys.clk signal.

As another example, the above code indicates simulator manager 42 input signal called "subsys2.str appearing a model node sys2.str is to be sampled in accordance with the TIMING_C pattern—three time units before the trailing edge of each sys2.clk signal.

With each simulated IC input signal defined and related to a particular reference clock signal and timing pattern, test bench 20 also includes "drive" statements indicating when each IC input signals produced by simulator interface 42 is to change state. The following are examples of "drive" statements:

subsys1.data[7:0]=8'h4h;
@1 subsys1.str <=0'h;
@2 subsys1.str=Z;

The first line of the above code indicates that the subsys1.data[7:0] signal is to be driven to the value 4h (hexadecimal) at its next "drive time". The signal's drive time, is the particular time during each cycle of its assigned reference clock signal that a signal may be driven to a different value. The drive time was specified in the above-described code that defined the subsys1.data[7:0] signal and assigned it to the TIMING_A timing pattern. The "=" symbol in the first line of the above code indicates that simulator manager 42 is to wait until it drives the subsys1.data[7:0] signal to the indicated value at its next drive time before executing a next line of test bench code.

The second line of the above test bench code indicates the single subsys1.str signal is to be driven to value 0 (hex) with a one system clock cycle delay (@1) following a next system clock cycle. The "<=" symbol indicates that simulator manager 42 is to move to the next test bench code line without waiting to take the action indicated by the current line.

The third line of the above test bench code indicates the single subsys1.str signal is to be driven to a "Z" state (i.e. tristated) with a two system clock cycle delay (@2) following a next system clock cycle.

With each simulated IC output signal defined and related to a particular reference clock signal and timing pattern, test bench 20 also includes "expect" statements indicating values various simulated IC output signals are expected to have at various times during the test. The following are examples of "expect" statements:

subsys1.data[7:0]==8'00XXX110b;
@0,100 subsys1.data [7:0] ==8'4h;

The first line of the above code indicates that the eight subsys1.data[7:0] signals are to have the value 00XXX110 at its next sampling time where "0" is a low logic level, "1" is a high logic level, and "X" is either high or low logic (i.e. "don't care". The sampling time relative to each system clock cycle was specified in the code that defined the TIMING_A pattern and the subsys1.data[7:0] signal. Simulator manager 42 records a simulation failure in the SFAIL field in the waveform data for that cycle if the data is not of the expected value. In this case the SFAIL field would have eight bits, each indicating whether a corresponding bit of the subsys1.data[7:0] signal failed to match its expected state.

The second line of the above test bench code indicates that the subsys1.data signal is to be compared to expected value of 4h (hex) at its appropriate sampling time during each of the next 100 system clock cycles. If the subsys1.dat[7:0] signal fails to switch to and stay at the indicted value by the 100th system clock cycle, the simulator manager 42 sets the SFAIL field of the waveform data for that 100th cycle to record the simulation failure.

Although not explicitly commanded to do so by test bench 20, simulator manager 42 also samples each simulated IC input and output signal value during each cycle of the system clock signal and produces waveform data representing the signal's behavior. The timing pattern that the test bench 20 assigns to each IC input and output signal indicates the time at which each sample is to be sampled during each system clock cycle. Thus all IC input and output signals need not be sampled at the same time during each master clock signal cycle.

Tester Rules Checking

Before initiating an IC simulation in response to an input test bench 20, simulator manager 42 parses test bench 20 to determine whether the test it defines is within the capability of IC tester 14 as indicated by a "tester rules" file 54. Simulator manager 42 counts the number of IC input and output signals defined by test bench 20 and compares the count to the available number of tester channels 24. When tester 14 does not have a sufficient number of tester channels, simulator manager 42 displays an appropriate error message. Simulator manager 42 also checks the frequency of the master clock signal identified by test bench 20 to determine whether it is within the period clock signal (PCLK) frequency range of the tester. When tester manager 46 generates the instruction sets for tester channels 24 based on the waveform data produced by simulator manager 42 it checks the size of channel instruction memories 32 and displays an error message when the size of any instruction set exceeds storage capacity of the instruction memory 32 to receive the instruction set.

Tester Manager

Tester manager 46 processes the waveform data stored in database files 23 for each IC input and output signal to produce control data and instructions for each channel 24 of IC tester 14 of FIG. 1 and stores the instructions and control data for each channel in database files 23. When IC 16 is to be tested, tester manager reads the channel instructions and control data out of database files 23, sends them to the tester channels 24 and initiates the test. After the test is complete, tester manager acquires the TFAIL data from the tester channels 24 and incorporates it into the waveform data stored in database files 23.

The waveform data for each signal includes a header indicating the system clock period and "timeset" data indicting the time during each test cycle that each IC input or output signal is to be driven or sampled. Tester manager 46 provides control data to the timing signal generator 28 of each channel to set the period of the PCLK and TS signals to match the period indicated by the system clock period data included in the waveform data header.

Each waveform data sequence represents the behavior of a simulated IC input or output signal (or a related group of simulated IC input or output signals) as a sequence of VALUE and DIR fields indicating the value and direction of the signal or signals during each successive test cycle. After simulator manager 42 generates a waveform data sequence, it invokes tester manager 46 telling it to produce a set of tester channel instructions for each IC input/output signal and to save the instructions in database files 23 so that they can be later provided to the appropriate tester channels 24 when they are to test IC 16.

Figure 3:
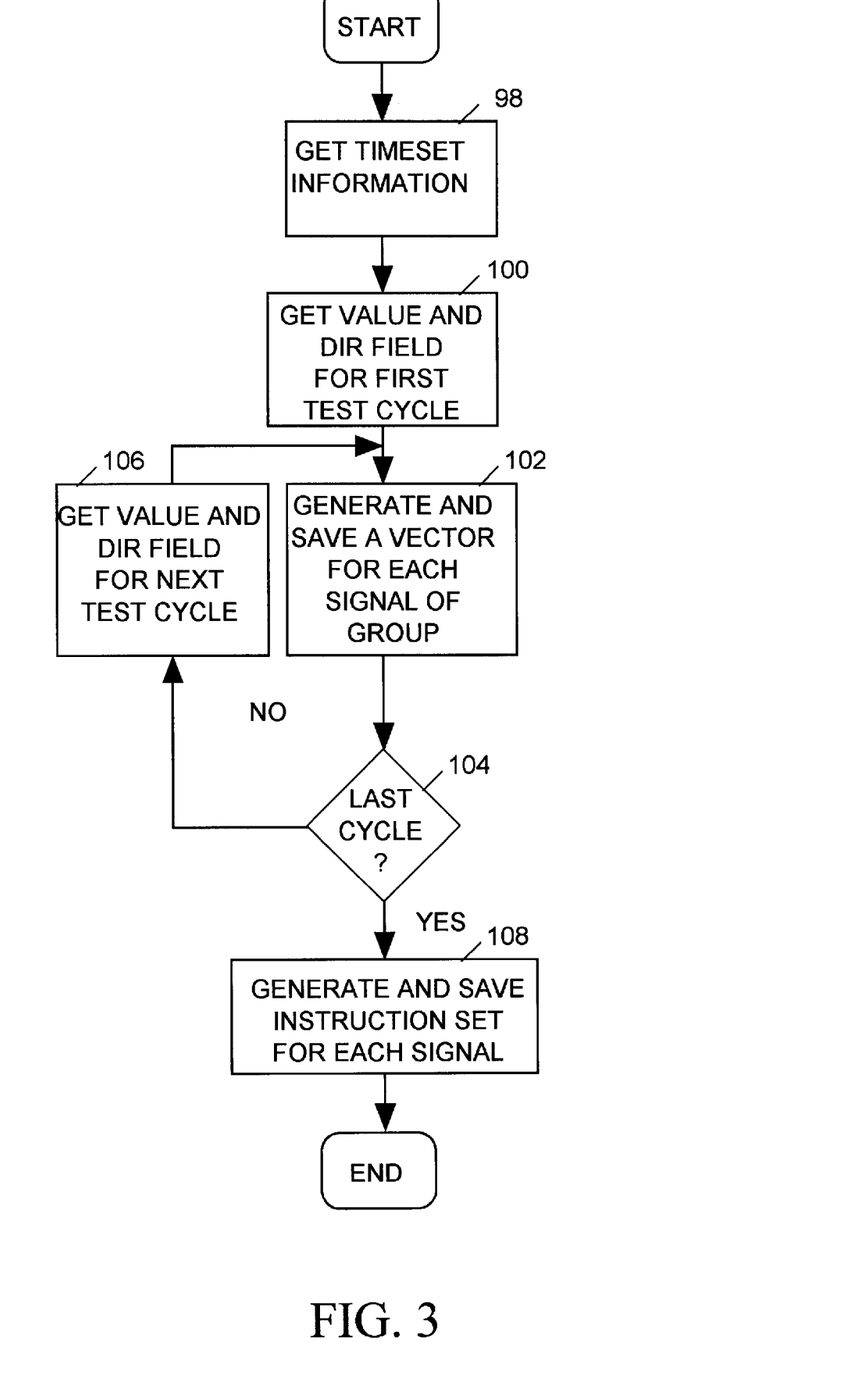
FIG. 3 is a flow chart illustrating operation of the tester manager of FIG. 2 in converting waveform data sequences into tester channel instructions.

FIG. 3 illustrates how tester manager 46 converts the VALUE and DIR fields of each waveform data sequence into tester channel instructions. For each simulated IC input and output signal represented by a waveform data sequence, tester manager 46 first processes the waveform data sequence to generate a vector sequence that is to be supplied to the pin electronics circuit 26 of a tester channel 24 (FIG. 1) during the test. The tester manager 46 then processes each vector sequence to produce a set of algorithmic tester instructions that represent the vector sequence in a more compact form.

Referring to FIG. 3, tester manager 46 initially reads the timeset information included in the waveform data header (step 98) to determine the time during each test cycle that each simulated IC signal represented by the waveform data was sampled. Tester manager 46 then reads the VALUE and DIR field of the waveform data sequence for the first test cycle (step 100). For each signal represented by the waveform data sequence tester manager 46 employs a look up table to convert the VALUE, DIR and TIMESET data into the first vector of the vector sequence to be supplied to the pin electronics circuit 26 of a tester channel 24 corresponding to the IC signal (step 102). If the DIR field indicates a signal is acting as an IC input signal during the test cycle, two bits of the generated vector indicate the state of the signal is to be driven at the appropriate drive time during the test cycle (0, 1, or Z) and other bits of the vector indicate which timing signal TS (FIG. 1) the pin electronics circuit 26 is to use to control timing of the IC input signal state change. If the DIR field indicates the signal is acting as an IC output signal during the test cycle, two bits of the vector indicate the IC output signal's expected state (0,1 or X) and the remaining bits indicate which timing signal TS is to control sampling of the IC output signal during the test cycle.

If the vectors for the last test cycle have not been produced (step 104), tester manager 46 reads the VALUE and DIR fields for a next test cycle (step 106) and returns to step 102 to generate a vector for each IC signal represented by the waveform data for the next test cycle. Tester manger 46 continues to loop through step 102–106 until it has generated and stored in database files 23 a vector data sequence for each IC signal including vector data for each test cycle. At that point it processes each vector data sequence to generate an instruction set that will cause an instruction processor 30 to reproduces the vector data sequence during a test (step 108). The tester manager 46 saves each instruction set in database files 23. Each instruction set also includes the control data needed to adjust the period of the period clock PCLK produced by timing signal generators 28.

When all waveform data sequences have been converted into instruction sets, and the user provides tester manager 46 with pin map 36, the tester manager reads the instruction sets out of database files 23, writes them into the instruction memories 32 (FIG. 1) of the appropriate tester channels 24 and starts the test. After the test is complete, the tester manager acquires the TFAIL data from the tester channels and updates the waveform data stored in database files 23 to include the TFAIL data.

Instruction Generation

The sequence of vectors that each pin electronics circuit 26 needs during a test can be quite large when the test spans a large number of test cycles. To make efficient use of each channel's instruction memory 32 capacity, tester manager 46 converts each vector sequence to a more compact set of 8-bit algorithmic instructions for generating the vector sequence. Typically for a long test, the vector sequence for each channel will include one or more repetitive patterns. For example a sequence of 10,000 vectors that tells a tester channel to continuously drive an IC input signal high for 10,000 test cycles can be replaced with one vector and a loop instruction indicting that the vector is to be repeated 10,000 times. A sequence of 20,000 vectors telling a channel to toggle an input test signal between high and low logic levels for 20,000 test cycles can be replaced with two vectors and a loop instruction indicating the two vectors are to be repeated 10,000 times. Tester manager 46 therefore parses the vector sequence it generates for each signal to locate repetitive sequences and replaces multiple instances of each vector sequence with loop instructions. U.S. Pat. No. 4,994,732 issued Feb. 19, 1991 to Jeffery et al and incorporated herein by reference describes a tester including instruction processor capable of executing loop instructions embedded in a vector sequence. Other techniques for compressing vector sequences are also known. U.S. Pat. No. 5,696,772 issued Dec. 9, 1997 to Lesmeister and incorporated herein by reference discloses a system using several techniques for compressing vector sequences into a compact set of instructions for each tester channel and an instruction processor capable of executing the instructions.

Tester Rules Checking

Before initiating an IC simulation in response to an input test bench 20, simulator manager 42 parses test bench 20 to determine whether the test it defines is within the capability of IC tester 14 as indicated by a "tester rules" file 54. Simulator manager 42 counts the number of IC input and output signals defined by test bench 20 and compares the count to the available number of tester channels 24. When tester 14 does not have a sufficient number of tester channels, simulator manager 42 displays an appropriate error message. Simulator manager 42 also checks the frequency of the master clock signal identified by test bench 20 to determine whether it is within the period clock signal (PCLK) frequency range of the tester. When tester manager 46 generates the instruction sets for tester channels 24 based on the waveform data produced by simulator manager 42, it checks the size of channel instruction memories 32 and displays an error message when the size of any instruction set exceeds storage capacity of the instruction memory 32 to receive the instruction set.

Waveform and Code Display

Figure 4:
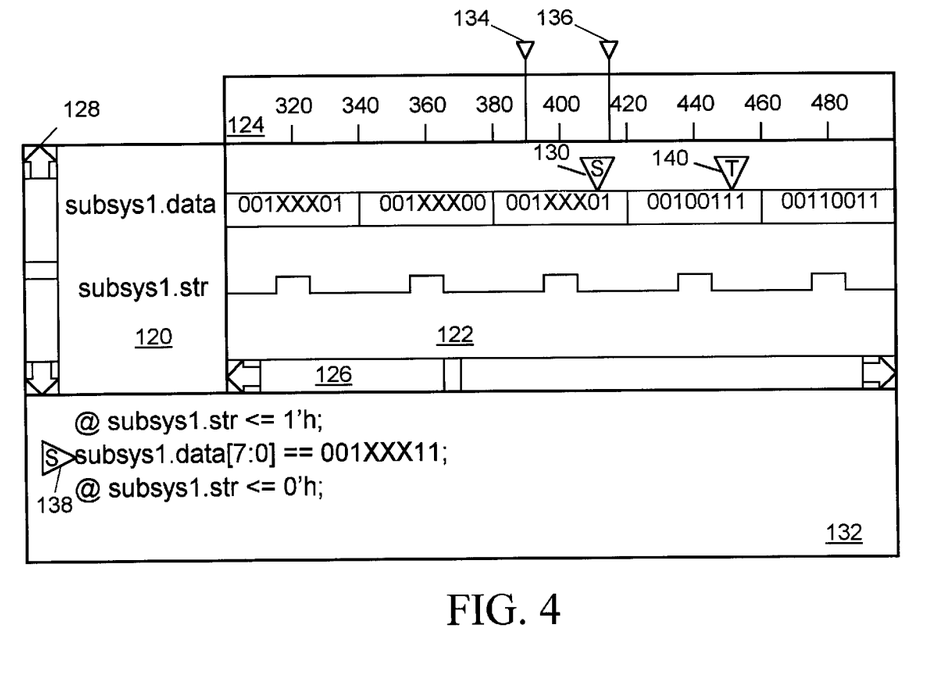
FIG. 4 illustrates a typical waveform display that the debug/display manager of FIG. 2 generates on the display monitor of FIG. 1.

FIG. 4 illustrates a typical display that debug/display manager 50 of FIG. 2 produces on display monitor 22 of FIG. 1. Signal names are displayed in a window 120 and representations of the waveform data sequences are displayed in a window 122 adjacent to corresponding signal names. A window 124 indicates relative time since the start of the test. A horizontal scroll bar 126 allows a user to scroll the display backwards and forwards in time and a vertical scroll bar 128 allows the user to scroll through a list of input and output signals. An icon 130 marks any point along a waveform display where a simulated IC output signal value failed to match an expected value. The debug/display manager displays the test bench statements in a window 132 that correspond in time to a displayed portion of the waveform data indicated by user movable bars 134 and 136. Any expect statement indicating an expected value that a simulated output signal failed to match is marked with an icon 138. An icon 140 marks any point along a waveform display for which TFAIL data included in the waveform indicates that the value of an IC output signal failed to match the value of the corresponding simulated output signal.

Thus has been described a system including an integrated IC simulator and IC tester for testing both simulated and real versions of an integrated circuit in response to the same test bench file. Although the IC tester has bounded pin, data and time domains not shared by the simulator, the test bench file syntax and the manner in which simulator manager drives the simulator in response to the test bench file, impose similar bounds on simulator operation so that simulated and real versions of an IC can be tested in the same manner to provide comparable test results. While the forgoing specification has described a preferred embodiment of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for testing an integrated circuit (IC) having a plurality of real input and output signals, the system comprising:

an IC simulator for simulating response of said IC to a plurality of simulated input signals by producing a plurality of simulated output signals, each simulated input and output signal corresponding to a separate one of said real input and output signals;

a simulator manager for providing said simulated input signals to the IC simulator and for generating a plurality of waveform data sequences, each representing sampled values of a corresponding one of said simulated IC input and output signals;

an IC tester including a separate channel corresponding to each of said real input and output signals; and a tester manager for converting the waveform data sequence corresponding to each simulated input signal to a separate set of instructions provided as input to a corresponding one of said IC tester channels, wherein each IC tester channel corresponding to a real input signal responds to its input instructions by generating and supplying to said IC a real input signal having the sequence of values represented by the waveform data sequence representing a corresponding simulated input signal.

2. The apparatus in accordance with claim 1 wherein said tester manager also converts the waveform data sequence corresponding to each simulated output signal to a separate set of instructions provided as input to a corresponding one of said IC tester channels, and wherein each IC tester channel corresponding to a simulated output signal responds to its input instructions by periodically sampling a real output signal to produce a sequence of values and by determining whether said sequence of values matches the sampled values represented by the waveform data sequence corresponding to said simulated output signal.

3. The apparatus in accordance with claim 1 wherein said simulator manager also determines whether said simulated output signals are of expected values at various times while said simulator is simulating said IC.

4. The apparatus in accordance with claim 1 further comprising means for reading data sequences produced by said simulator manager and for displaying graphic representations of said waveform data sequences.

5. The apparatus in accordance with claim 2 wherein said simulator manager also determines whether said simulated output signals are of expected values at various times while said simulator is simulating said IC.

6. The apparatus in accordance with claim 5 further comprising means for reading data sequences produced by said simulator manager and for displaying graphic representations of said waveform data sequences.

7. The apparatus in accordance with claim 1 wherein said simulator also generates at least one simulated reference clock signal and wherein said simulator manager samples each simulated input and output signal in response to said at least one simulated reference clock signal.

8. The apparatus in accordance with claim 7 wherein said simulator produces state changes in said simulated input signals in response to said at least one simulated reference clock signal.

9. A method for testing an integrated circuit (IC) having a plurality of real input and output signals, the method comprising the steps of:

simulating response of said IC to a plurality of simulated input signals by producing a plurality of simulated output signals, each simulated input and output signal corresponding to a separate one of said real input and output signals;

generating a plurality of waveform data sequences, each representing periodically sampled values of a corresponding one of said simulated IC input and output signals;

processing each waveform data sequence representing a simulated input signal to generate and supply to said IC a corresponding real input signal having a sequence of values represented by the processed waveform data sequence.

10. The method in accordance with claim 9 further comprising the steps of:

periodically sampling a real output signal corresponding to each simulated output signal to produce a sequence of values and determining whether said sequence of values matches the periodically sampled values represented by the waveform data sequence representing the corresponding simulated output signal.

11. The method in accordance with claim 9 further comprising the step of determining whether said simulated output signals are of expected values at various times while said simulator is simulating said IC.

12. The method in accordance with claim 9 further comprising the step of displaying graphic representations of said waveform data sequences.

13. The method in accordance with claim 10 further comprising the step of determining whether said simulated output signals are of expected values at various times while said simulator is simulating said IC.

14. The method in accordance with claim 13 further comprising the step of displaying graphic representations of said waveform data sequences.

* * * * *